United States Patent [19]

Hisajima

[11] Patent Number: 5,201,804
[45] Date of Patent: Apr. 13, 1993

[54] SEMICONDUCTOR MANUFACTURING APPARATUS HAVING A MOVABLE-AREA COVERING MECHANISM

[75] Inventor: Yoshimitsu Hisajima, Tokyo, Japan

[73] Assignee: Kabushiki Kaisha Shinkawa, Tokyo, Japan

[21] Appl. No.: 749,295

[22] Filed: Aug. 23, 1991

[30] Foreign Application Priority Data

Aug. 24, 1990 [JP] Japan ................................ 2-221143

[51] Int. Cl.$^5$ ............................................. A47B 13/08
[52] U.S. Cl. ..................................................... 108/90
[58] Field of Search ............................... 108/90, 67, 68

[56] References Cited

U.S. PATENT DOCUMENTS

| | | | |
|---|---|---|---|
| 1,237,170 | 8/1917 | Cline | 108/90 |
| 1,505,003 | 8/1924 | Pylick | 108/90 X |
| 1,952,775 | 3/1934 | Quinlan | 108/90 |
| 2,515,466 | 7/1950 | Nahmens | 108/90 |

FOREIGN PATENT DOCUMENTS

2836586  3/1980  Fed. Rep. of Germany ........ 108/90

Primary Examiner—Jose V. Chen
Attorney, Agent, or Firm—Koda and Androlia

[57] ABSTRACT

A covering mechanism for covering an area in which a movable table, etc. of, for example, semiconductor assembling machines using a flexible sheet cover that has elasticity. One end of the cover is fastened to a take-up shaft and the other end to a movable member that moves over the movable table, etc. in the direction perpendicular to the take-up shaft. The cover wrapped around the take-up shaft is stretched out when the movable member is moved away from the take-up shaft, thus covering the table. When the movable member is moved towards the take-up shaft, the cover, with the elasticity, is back to be wrapped around the take-up shaft. By arranging a plurality of take-up shafts at right angles, the covers can stretch in the directions perpendicular to each other, thus covering a wider area in which an X-Y table is moved around.

4 Claims, 3 Drawing Sheets

SEMICONDUCTOR MANUFACTURING APPARATUS HAVING A MOVABLE-AREA COVERING MECHANISM

BACKGROUND OF THE INVENTION

1. Field of the Invention

The present invention relates to a movable-area covering mechanism for covering X-Y tables, etc.

2. Prior Art

Conventionally, in industrial machineries, such as semiconductor manufacturing apparatuses, two different types of tables are used: one is a table which moves uniaxially (or in the X or Y direction only) and the other is a table which moves biaxially (or in both the X and Y directions). For these tables, covers are used so as to cover the area wherein the tables are moved, thus avoiding dust from the table moving areas, securing a safety, and improving the appearance of the table, etc.

Several different types of movable-area covering mechanisms are know presently. These are shown in FIGS. 4 through 7.

FIG. 4 illustrates a bellows type covering system. One end of a bellows 40 is fastened to a fixed cover 1, and the other end to a movable member 4 which is secured to the table.

FIG. 5 shows a single-plate type cover. A covering plate 41 is fastened to a movable member 4 so that the covering plate 41 covers the opening 1a of the fixed cover 1.

In FIG. 6, a stacked-plate type covering system is illustrated. In this covering system, a multiple number of covering plates 42, 43 and 44 are placed one on the other and fit over a movable member 4. These covering plates are mounted on the surface of a fixed cover 1. Openings 42a, 43a and 44a are formed in the covering plates 42, 43 and 44 respectively, so that they are successively smaller than the opening 1a formed in the fixed cover 1.

FIG. 7 shows a skirt type covering system. In this system, one end of a skirt 45 is fastened to a fixed cover 1, while the other end of the skirt 45 is fastened to a movable member 4.

However, these conventional covering systems have problems.

In the bellows type system, the thickness C of the bellows 40, when contracted, is still large. Accordingly, it is impossible to install the bellows 40 in a small space. In addition, the stroke (distance) of the movable member 4 is small. If the stroke of the movable member 4 is large, then a larger space is required. Furthermore, this system tends to be expensive to manufacture, and trash, etc., are likely to accumulate in the valleys of the bellows 40. Thus, the dimension C increases as the stroke of the movable member 4 becomes longer.

In the case of single-plate type system of FIG. 5, a space is required for the entire stroke of the movable member 4; accordingly, it is impossible to install this mechanism in a small place.

In the stacked-plate type system shown in FIG. 6, several numbers of covering plates (more than three as shown in the Figure) are required as the opening 1a in the fixed cover 1 becomes larger. As a result, the covering plates generate more dirt when rubbed against each other. Furthermore, the manufacturing costs are high.

In the skirt type system shown in FIG. 7, the drooping skirt part 45a is easily entangled with the movable member 4 when the movable member 4 moves to one end of the opening 1a.

SUMMARY OF THE INVENTION

The present invention was made in light of the problems encountered in the prior art systems described above.

The main object of the present invention is to provide a movable-area covering mechanism which can be installed in a small space, can cover a wide movable area, is simple to install, and can be manufactured inexpensively.

The object of the present invention is accomplished by a unique structure of a covering mechanism in which one end of a mobile cover which has spring properties is fastened to a cover shaft so as to be wrapped around it, and the other end of the mobile cover is fastened to a movable member.

When the movable member moves away from the cover shaft, it pulls out the mobile cover from the cover shaft. Conversely, when the movable member moves toward the cover shaft, the mobile cover is wrapped around the cover shaft as a result of the spring properties of the mobile cover.

Thus, since the mobile cover is constructed so that it is wrapped around the cover shaft, the cover can be installed in a narrow space and can cover a wide movable area. Furthermore, installation is simple, and manufacturing costs are low.

DETAILED DESCRIPTION OF THE INVENTION

An operating principle of one embodiment of the present invention will be first described with reference to FIG. 1.

A cover shaft 2 is positioned at the side of fixed cover 1. One end of a mobile cover 3 which consists of a thin plate material with spring properties (e.g., an SUS spring material or plastic material, etc.) is fastened to the cover shaft 2. The mobile cover 3 with one end thereof being fastened to the cover shaft 2 is wrapped around the cover shaft 2 in the form of a coil (with appropriate spaces left between the individual turns of the coil). The other end of the mobile cover 3 is fastened to movable member 4.

As to the thickness of the mobile cover 3, approximately 0.01 to 0.08 mm is appropriate when it is made of SUS spring material and about 0.05 to 0.2 mm when made of plastic.

When the movable member 4 moves in the direction of arrow A, the mobile cover 3 is pulled out by the movable member 4 and stretched. In this case, the coil diameter D of the mobile cover 3 decreases. On the other hand, when the movable member 4 moves in the direction of arrow B, the coil diameter D increases as a result of the spring properties of the mobile cover 3. Thus, the length of the stroke of the movable member 4 is absorbed. Accordingly, if the length of the mobile cover 3 wound up is sufficiently long relative to the stroke of the movable member 4, the change in the coil diameter D can be ignored.

As seen from the above, since the mobile cover 3 is wrapped around the cover shaft 2, the mobile cover 3 can be installed in a narrow space though it can cover a wide area. Furthermore, installation is simple and manufacturing costs are low.

In the above description, the cover shaft 2 is mounted to the fixed cover 1. However, if the mobile cover 3 is treated beforehand so as to assume a coil spring shape, the cover shaft 2 may be free to rotate on the fixed cover 1. In this case, when the movable member 4 moves in the direction of arrow A, the mobile cover 3 is pulled by the movable member 4 and extended. The cover shaft 2 also rotates. Meanwhile, when the movable member 4 moves in the direction of arrow B, spring properties act which tend to restore the mobile cover 3 to the original shape to which the mobile cover 3 is habituated beforehand. As a result of this restoring force, the cover shaft 2 rotates, and the mobile cover 3 is wrapped around the cover shaft 2.

Figure 1:
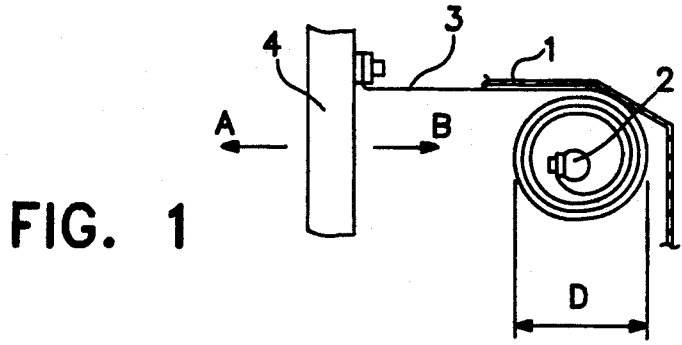
FIG. 1 is an explanatory diagram which illustrates the operating principle of the covering mechanism of the present invention.
Figure 2:
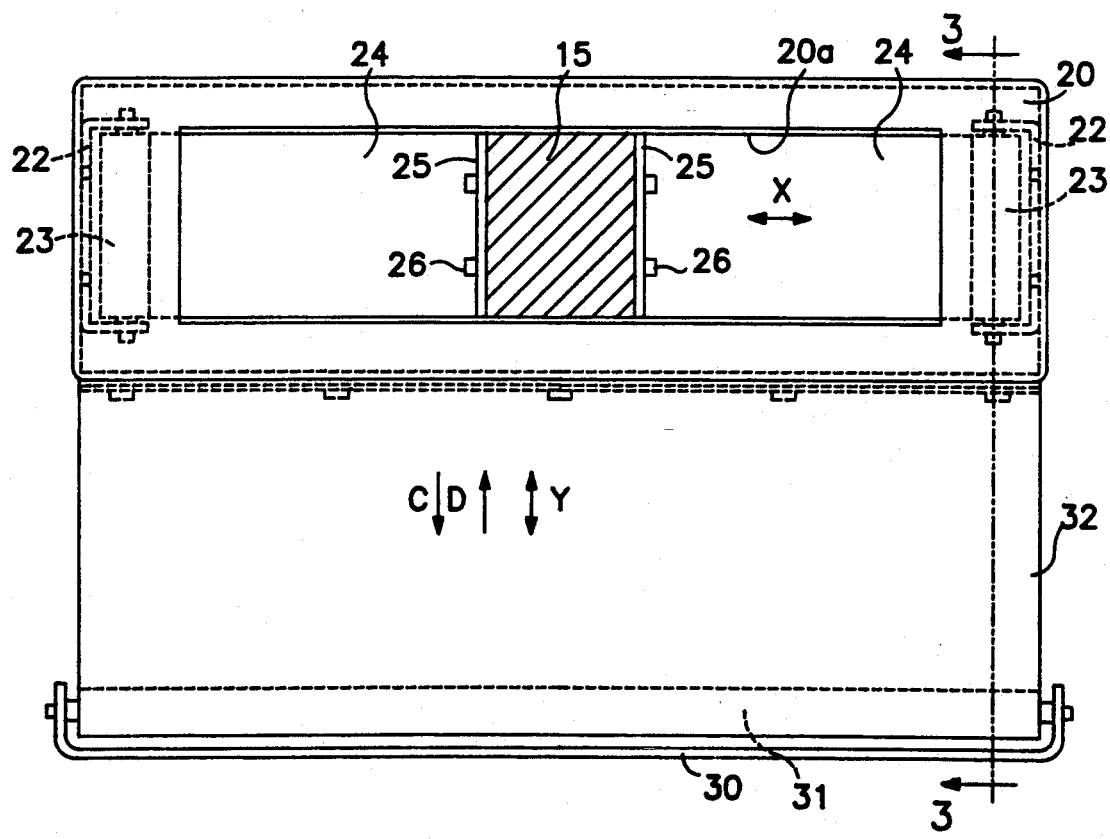
FIG. 2 is a plan view which illustrates an embodiment of the present invention.
Figure 3:
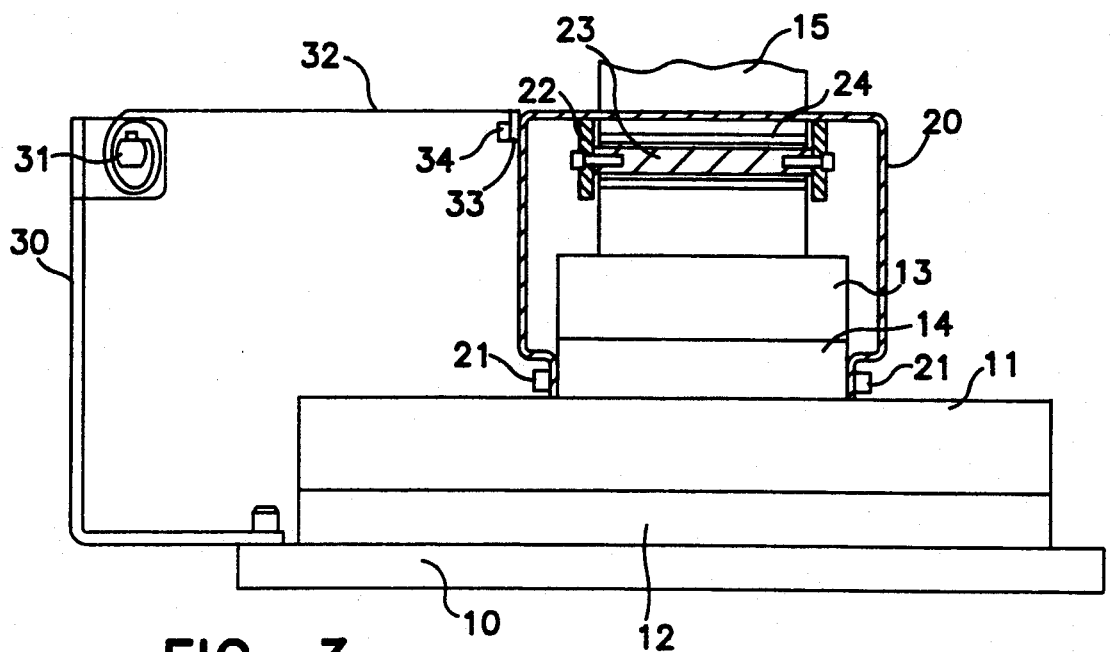
FIG. 3 is a cross section taken along the line 3—3 in FIG. 2.
Figure 4:
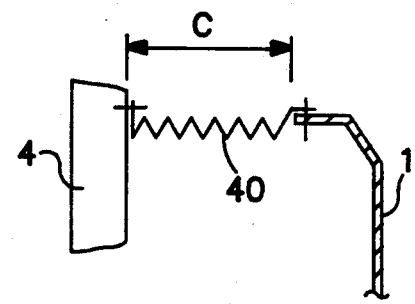
FIG. 4 illustrates prior art bellows type covering system.
Figure 5:
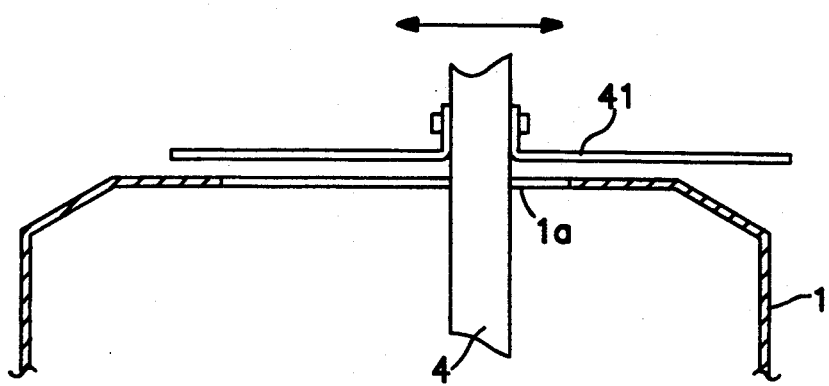
FIG. 5 illustrates prior art single-plate type covering system.
Figure 6:
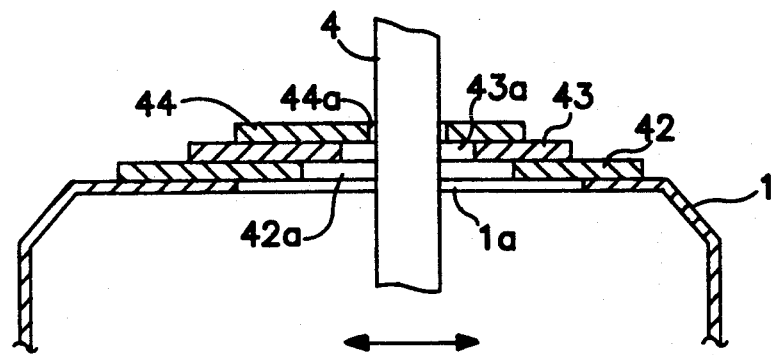
FIG. 6 illustrates prior art stacked-plate type covering system.
Figure 7:
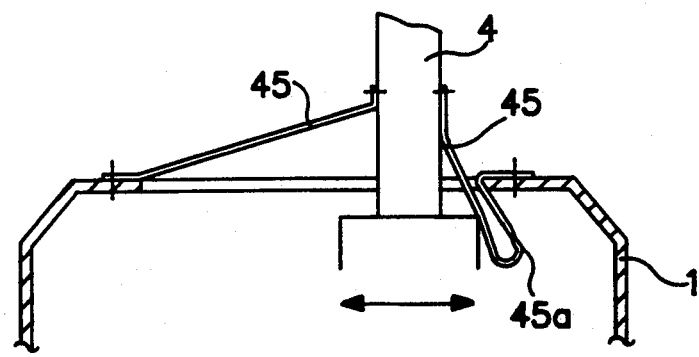
FIG. 7 illustrates prior art skirt type covering system.

FIGS. 2 and 3 shows, in a concrete manner, an embodiment of the covering mechanism that uses an operating principle illustrated in FIG. 1.

A Y-direction guide table 12 which guides a Y table 11 in the Y direction is provided on the surface of a base 10. An X-direction guide table 14 which guides an X table 13 in the X direction is provided on the surface of the Y table 11. The Y table 11 and X table 13 are driven by respective motors (not shown). This structure is a known structure which is generally referred to as an "X-Y table". A movable member 15 is provided above the X table 13 of the X-Y table.

A box shape fixed cover 20 is secured by screws 21 to the side surfaces of the X-direction guide table 14 (i.e., the side surfaces of the table 14 being parallel to the X direction) so that the cover 20 covers the X table 13. An opening 20a which extends in the X direction is formed in the upper surface of the fixed cover 20, so that the movable member 15 can move freely in the X direction.

U-shaped holders 22 are secured to the both inside end surfaces of the fixed cover 20 in the direction facing the opening 20a, and an X direction cover shaft 23 is installed in each of these holders 22.

An X-direction mobile cover 24 which has spring properties is fastened, at one end, to each of the X-direction cover shafts 23 so as to be wrapped around it. Other end of each cover 24 is fastened by means of retaining plate 25 and screws 26 to one of the sides of the movable member 15. Thus, the entire movable area in the X direction is covered by the fixed cover 20 and the X-direction mobile covers 24.

A fixed frame 30, which is L-shaped in cross section (see FIG. 3) and is bent into U shape when seen from the above, is fastened to one end of the top surface of the base 10. A Y-direction cover shaft 31 is mounted to this fixed frame 30. A Y-direction mobile cover 32, which has spring properties and is fastened to the Y-direction cover shaft 31 at one end, is wrapped around the shaft 31 in the form of a coil spring. The other end of the Y-direction mobile cover 32 is fastened by means of a retaining plate 33 and screws 34 to one of the side surfaces of the fixed cover 20. The Y direction mobile cover 32 covers the Y-direction movable area of the X-Y table.

In the above embodiment, the X-direction cover shafts 23 are mounted to the fixed cover 20, and the Y-direction cover shaft 31 is mounted to the fixed frame 30. However, as seen from the illustration of FIG. 1, it is possible to rotatably provide the X-direction cover shafts 23 in the fixed cover 20 and to rotatably provide the Y-direction cover shaft 31 in the fixed frame 30.

In operation, when the Y table 11 moves in the Y direction, the X-direction guide table 14, the X table 13, the movable member 15 and the fixed cover 20 also move in the Y direction.

When the movable member 15 is moved in the direction shown by arrow C in FIG. 2, the Y-direction mobile cover 32 is wrapped around the Y-direction cover shaft 31 as a result of the arrow C direction movement of the fixed cover 20 which is mounted to the X-direction guide table 14.

When the movable member 15 is moved in the direction of arrow D in FIG. 2, the Y-direction mobile cover 32 is pulled out and extended as a result of the arrow D direction movement of the fixed cover 20.

During the above two movements of the movable member 15, since one end of each of the X-direction mobile covers 24 is fastened to one of the X-direction cover shafts 23 (which are secured to the fixed cover 20), and since the other end of each X-direction mobile cover 24 is fastened to the movable member 15, the X-direction mobile covers 24 move together with the movable member 15 in the arrow C direction and in the arrow D direction.

On the other hand, when the X table 13 is moved to the left (in the drawing) in the X direction, the left-side X-direction mobile cover 24 is pushed towards the left-side X-direction cover shaft 23. As a result, the left-side cover 24 naturally coils up. In this case, the right-side X-direction mobile cover 24 is pulled out from the right-side X-direction cover shaft 23.

When the X table 13 is moved in the opposite direction to the movement described above, in other words to the right (in the drawing) in the X direction, an action which is exactly the opposite to the above takes place.

The above description is made with reference to a case in which the X table 13 and the Y table 11 are moved independently. When the two tables are moved at the same time (or moved in any direction on a plane), a combination of the above described actions take place.

Below, the embodiment described above in a concrete manner in FIGS. 2 and 3 is compared with the principle of the present invention shown in FIG. 1:

When an attention is given to the X table 13, then the fixed cover 20, X-direction cover shafts 23 and X-direction mobile covers 24 shown in FIGS. 2 and 3 respectively correspond to the fixed cover 1, cover shaft 2 and mobile cover 3 shown in FIG. 1. Also, when an attention is given to the Y table 11, then the fixed frame 30, Y-direction cover shaft 31 and Y-direction mobile cover 32 shown in FIGS. 2 and 3 respectively correspond to the fixed cover 1, cover shaft 2 and mobile cover 3 in FIG. 1.

Meanwhile, in the embodiment described above, the fixed cover 20 is secured to the X-direction guide table 14. However, it can be secured to the Y table 11. Moreover, instead of securing the fixed frame 30 to the base 10, it is possible to secure the frame 30 to the Y-direction guide table 12.

Furthermore, the above embodiment is written with reference to covers for movable member that moves biaxially (or in X and Y directions). However, it goes without saying that the present invention can be applied to coverings for movable member that moves uniaxially (or in a single direction) by means of air cylinders, hydraulic cylinder, etc.

In addition, in the embodiments described above, the mobile covers 3, 24 and 32 are formed in a single integral element from a material having spring properties. However, the covers can be formed in such a manner that only the portions which are wrapped around the cover shafts are made of a spring-type material and fasten one end of a cloth material to the movable member and other end to the covers.

As seen from the above, according to the present invention, one end of a mobile cover that has spring properties is fastened to a cover shaft so that the cover is wrapped around the shaft, and the other end of the cover is fastened to a movable member. As a result, the covering mechanism can be installed in a narrow space but can cover the wide areas. Furthermore, the mechanism is simple to install and can be manufactured inexpensively.

I claim:

1. A semiconductor manufacturing apparatus having a movable-area covering mechanism for covering an X-Y table while the X-Y table is being moved characterized in that said mechanism comprising:

an X-Y table comprising a base, a Y-direction guide table provided on said base, a Y-table guided by said Y-direction guide table, an X-direction guide table provided on said Y-table and an X-table guided by said X-direction guide table, a movable member which is provided above and mounted on said X table, a fixed cover which is secured to said X-direction guide table, said fixed cover being provided with an opening formed in a direction of movement of the X table, an X-direction cover shaft which is secured to an end of the fixed cover on a side located in the direction of movement of the X table, an X-direction mobile cover with one end thereof being fastened to and wrapped around the X-direction cover shaft and an other end thereof being fastened to the movable member, a fixed frame which is secured to said base, a Y-direction cover shaft which is fastened to an end of the fixed frame that is located in the direction of movement of the Y-table, and a Y-direction mobile cover with one end thereof being fastened to and wrapped around the Y-direction cover shaft and an other end thereof being fastened to the fixed cover.

2. A movable-area covering mechanism according to claim 1, wherein said mobile cover is made of SUS spring material of 0.01 to 0.08 mm in thickness.

3. A movable-area covering mechanism according to claim 2, wherein said fixed frame is L-shaped in cross-section.

4. A movable-area covering mechanism according to claim 1, wherein said mobile cover is made of plastic material of 0.05 to 0.20 mm in thickness.

* * * * *